(12) United States Patent
Khaselev et al.

(10) Patent No.: US 10,710,336 B2
(45) Date of Patent: Jul. 14, 2020

(54) COMPOSITE AND MULTILAYERED SILVER FILMS FOR JOINING ELECTRICAL AND MECHANICAL COMPONENTS

(71) Applicant: ALPHA ASSEMBLY SOLUTIONS INC., South Plainfield, NJ (US)

(72) Inventors: Oscar Khaselev, Monmouth Junction, NJ (US); Bin Mo, East Brunswick, NJ (US); Monnir Boureghda, East Stroudsburg, PA (US); Michael T. Marczi, Chester, NJ (US); Bawa Singh, Marlton, NJ (US)

(73) Assignee: Alpha Assembly Solutions Inc., Waterbury, CT (US)

( * ) Notice: Subject to any disclaimer, the term of this patent is extended or adjusted under 35 U.S.C. 154(b) by 0 days.

(21) Appl. No.: 14/915,067

(22) PCT Filed: Aug. 29, 2014

(86) PCT No.: PCT/US2014/053489
§ 371 (c)(1),
(2) Date: Feb. 26, 2016

(87) PCT Pub. No.: WO2015/031801
PCT Pub. Date: Mar. 5, 2015

(65) Prior Publication Data
US 2016/0207286 A1 Jul. 21, 2016

Related U.S. Application Data

(60) Provisional application No. 61/871,435, filed on Aug. 29, 2013.

(51) Int. Cl.
*B22F 7/04* (2006.01)
*B32B 15/01* (2006.01)
*B22F 5/00* (2006.01)
*C22C 32/00* (2006.01)
(Continued)

(52) U.S. Cl.
CPC ............ *B32B 15/018* (2013.01); *B22F 5/006* (2013.01); *B22F 7/04* (2013.01); *B32B 15/01* (2013.01); *C22C 32/00* (2013.01); *C22C 49/00* (2013.01); *H01L 24/29* (2013.01); *H01L 24/32* (2013.01); *H01L 2224/29083* (2013.01); *H01L 2224/8384* (2013.01); *Y10T 428/12056* (2015.01); *Y10T 428/12063* (2015.01);
(Continued)

(58) Field of Classification Search
None
See application file for complete search history.

(56) References Cited

U.S. PATENT DOCUMENTS 4,429,344 A * 1/1984 Whitman ............... H01G 4/228
  29/25.42
4,492,730 A * 1/1985 Oishi ..................... B32B 15/08
  428/328
(Continued)

FOREIGN PATENT DOCUMENTS

CN    1564726 A    1/2005
CN   102272921 A   12/2011

*Primary Examiner* — Seth Dumbris
(74) *Attorney, Agent, or Firm* — Stinson LLP

(57) ABSTRACT

Materials for die attachment such as silver sintering films may include reinforcing, modifying particles for enhanced performance. Methods for die attachment may involve the of such materials.

16 Claims, 11 Drawing Sheets

(51) Int. Cl.
  *C22C 49/00* (2006.01)
  *H01L 23/00* (2006.01)
(52) U.S. Cl.
  CPC ............... *Y10T 428/12069* (2015.01); *Y10T 428/12076* (2015.01); *Y10T 428/12139* (2015.01)

(56) References Cited

U.S. PATENT DOCUMENTS

| | | | |
|---|---|---|---|
| 5,445,895 A * | 8/1995 | Behrens | H01H 1/027 428/546 |
| 6,689,186 B1 * | 2/2004 | Hampden-Smith | B01J 2/003 148/430 |
| 7,029,604 B2 | 4/2006 | Matsumora et al. | |
| 7,399,532 B2 * | 7/2008 | Seido | B32B 15/01 428/457 |
| 7,763,187 B1 | 7/2010 | Veedu et al. | |
| 2002/0166694 A1 * | 11/2002 | Nishide | B32B 18/00 174/255 |
| 2004/0245648 A1 | 12/2004 | Nagasawa et al. | |
| 2008/0017695 A1 * | 1/2008 | Okamoto | B23K 20/2333 228/248.1 |
| 2008/0220282 A1 * | 9/2008 | Jang | B32B 15/08 428/689 |
| 2010/0316821 A1 * | 12/2010 | Chang | B29C 47/0021 428/35.8 |
| 2011/0241494 A1 | 10/2011 | Bindig | |
| 2012/0003465 A1 * | 1/2012 | Rittner | B22F 1/0003 428/323 |
| 2012/0028025 A1 | 2/2012 | Wolde-Giorgis et al. | |
| 2012/0114927 A1 | 5/2012 | Khaselev et al. | |

\* cited by examiner 500 cycles 0 cycles

COMPOSITE AND MULTILAYERED SILVER FILMS FOR JOINING ELECTRICAL AND MECHANICAL COMPONENTS

CROSS-REFERENCE TO RELATED APPLICATIONS

This application is a U.S. national phase application and claims the benefit of priority under 35 U.S.C. § 371 of International (PCT) Patent Application Ser. No. PCT/US2014/053489, titled "COMPOSITE AND MULTILAYERED SILVER FILMS FOR JOINING ELECTRICAL AND MECHANICAL COMPONENTS" and filed on Aug. 29, 2014, which in turn claims priority to U.S. Provisional Patent Application Ser. No. 61/871,435 filed on Aug. 29, 2013, the contents of both of which are hereby incorporated herein by reference in their entireties for all purposes.

FIELD OF THE DISCLOSURE

The present disclosure is directed to methods of joining electrical or mechanical components, and more particularly to methods of attaching electronic components and associated devices onto circuit boards.

BACKGROUND

Sintering has emerged as an alternative technology to conventional soldering. Sintering typically involves high temperature and high pressure processing to attach various components of a printed circuit board assembly.

SUMMARY

In accordance with one or more aspects of the present disclosure, a silver film may comprise a mixture of silver and reinforcing (modifying) particles. Aspects of the silver film further may include providing a mixture comprising a sinterable silver particles layer, and reinforcing particles. The silver film further may comprise a support film configured to support the sinterable silver particles layer and the reinforcing particles. The reinforcing (modifying) particles can be metallic or non-metallic. The reinforcing (modifying) particles can be of various shapes and sizes, including spheres, granular, flakes, fibers, flowers and nanowires. The size of the reinforcing (modifying) particles can range from 2 nm to 10 μm. The reinforcing (modifying) particles that can be used to modify the properties of a sintered silver joint are copper, aluminum, glass, carbon, graphite and others. A concentration of the reinforcing (modifying) particles can range from 0.1 wt % by weight to 50 wt % by weight. The silver film may be a multilayer structure composed of at least two layers but can be three layers, including a reinforcing foil layer. The reinforcing foil layer can be silver, copper, gold or any other metal or any alloy. The reinforcing layer can be a metalized polymer or a ceramic foil. The reinforcing metal foil layer can be composite or clad structures with different layers of different metals and alloys. The reinforcing metal foil layer can be solid, perforated or in the form of mesh.

One or more other aspects may involve lamination processes using the disclosed films. Still further aspects may involve die attachment methods using the disclosed films.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. Where technical features in the figures, detailed description or any claim are followed by references signs, the reference signs have been included for the sole purpose of increasing the intelligibility of the figures and description. In the figures, each identical or nearly identical component that is illustrated in various figures is represented by a like numeral. For purposes of clarity, not every component may be labeled in every figure. In the figures:

DETAILED DESCRIPTION

Disclosed herein are embodiments of a sintered silver film composition, which improves the strength and elasticity of sintered silver joints. The improvement in strength and elasticity is achieved by addition of reinforcing particles and/or a solid metal layer to the sinterable matrix.

Sintered silver die attach films combine unique physical properties of nanosilver powder and innovative chemical formulations into products which allow joining various electronic devices to produce extremely reliable high thermal and electrical conductivity interfaces. Such films include those disclosed in co-owned, co-pending U.S. Patent Application Publication No. 2012/0114927 A1 ("SINTERING MATERIALS AND ATTACHMENT METHODS USING SAME") to Khaselev et al. which is hereby incorporated herein by reference in its entirety for all purposes. Sintered silver die attach films are uniquely positioned to fit into existing manufacturing equipment and processes to enable high volume manufacturing. The technology covers a wide variety of devices and applications from large area thyristors and power modules for electrical and automotive equipment to miniature discrete components for mobile technology and LED lighting. The technology improves the performance of existing power devices and increases their reliability five to ten times compared to traditional joining techniques. The films enable use of the new high temperature SiC and GaN devices with efficiency unattainable with the existing technologies.

Figure 1:
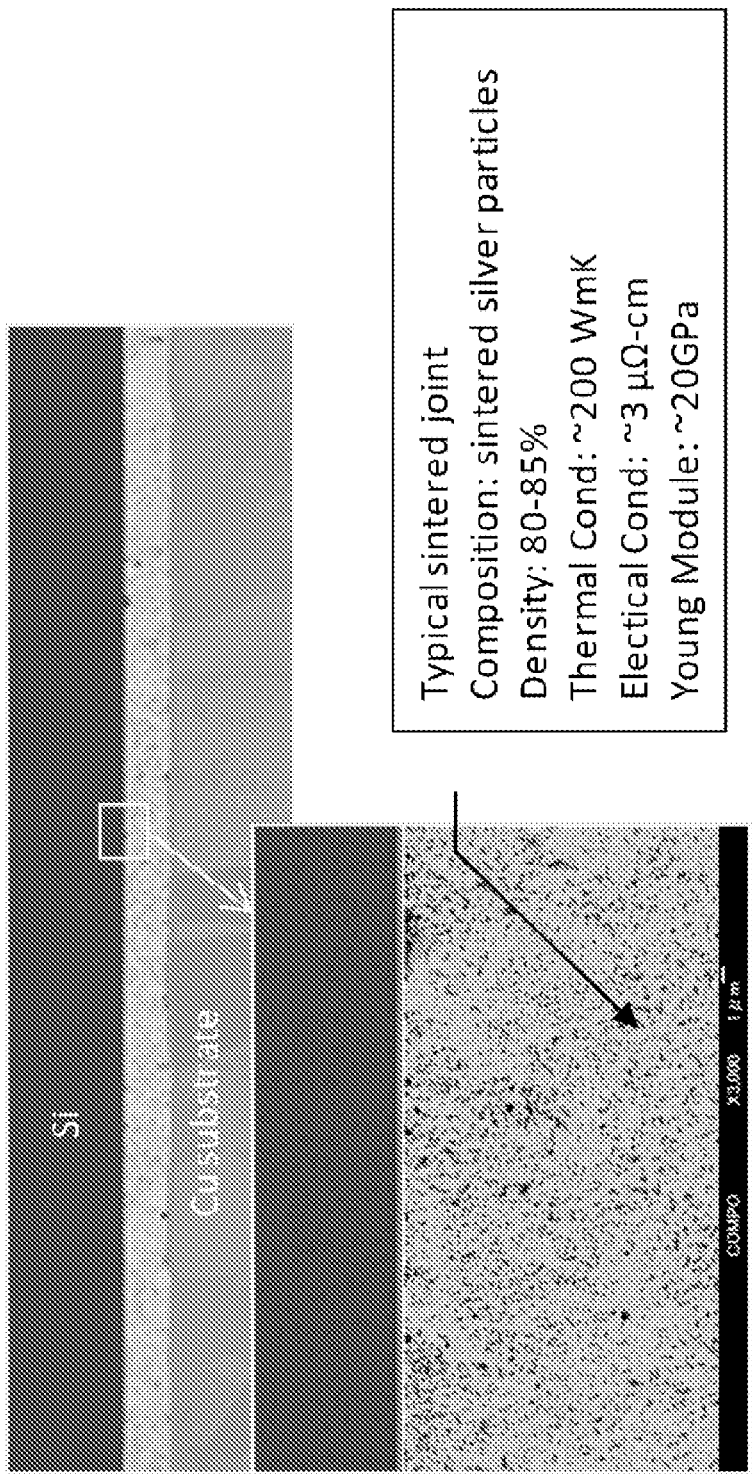
FIG. 1 presents a schematic of a joint in accordance with one or more embodiments.

Silver die attach films are the joining material which attaches an electronic device to a passive substrate or to another device. Silver film is applied to the back side of the die, wafer or substrate. Then the die, wafer or substrate is placed on a preheated substrate with a force sufficient to densify the film and establish an intimate connection between the material and the connected parts. Under the applied heat and pressure the film sinters and connects die to substrate, wafer to wafer, substrate to substrate. The resulting joint between the die and the substrate is metallic silver with the structure and properties as shown in FIG. 1.

For certain applications, modification of mechanical properties of the sintered silver joint is desirable. For example, higher elasticity will improve joint reliability for devices in which the CTE of connected parts is very different. Also, higher strength of the sintered silver layer will improve performance of the devices operating under high thermal or mechanical stress.

Figure 2:
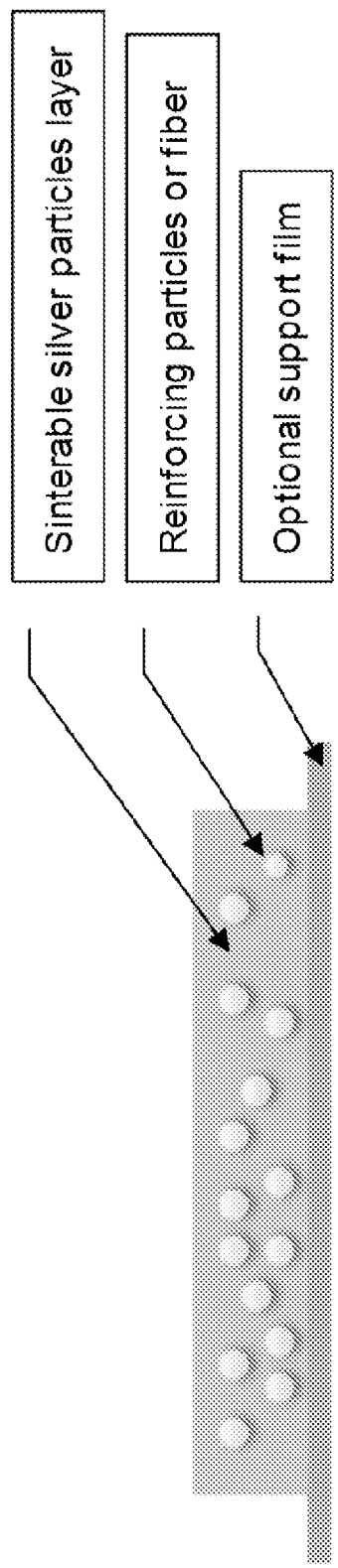
FIG. 2 presents a schematic of a composite silver film in accordance with one or more embodiments.

In accordance with one or more embodiments, a silver film may be a mixture of silver and reinforcing (modifying) particles, as schematically shown in FIG. 2.

The reinforcing (modifying) particles can be metallic or non-metallic. The particles can be of various shapes such as spheres (round), granular, flakes, flowers, fibers and/or nanowire. The size of the particles can range, for example, from about 2 nm to about 10 µm and above. Examples of particles that can be used to modify the properties of sintered silver joints are copper, aluminum, glass, carbon, graphite and others. The concentration of these particles can range from about 0.1 wt % to about 50 wt % in various embodiments.

Figure 3:
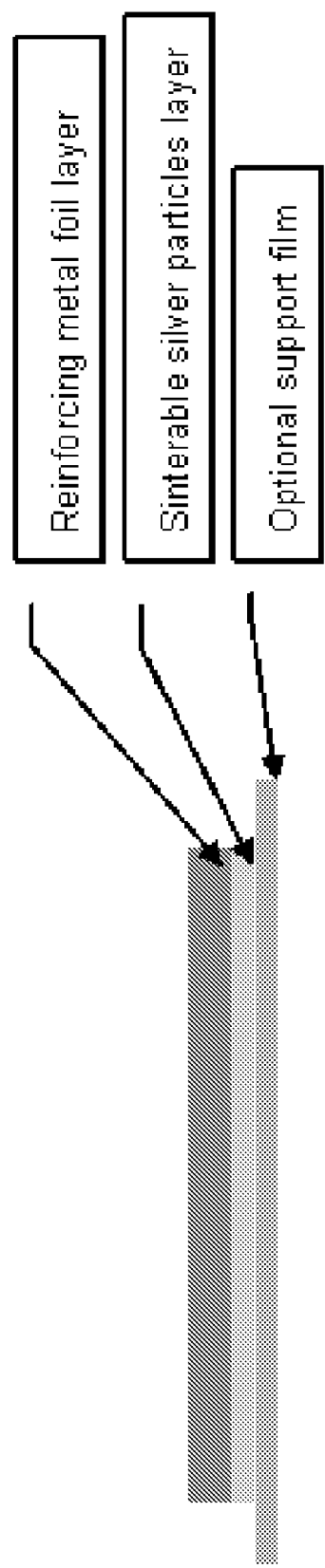
FIGS. 3 and 4 present schematics of composite silver films in accordance with one or more embodiments.
Figure 4:
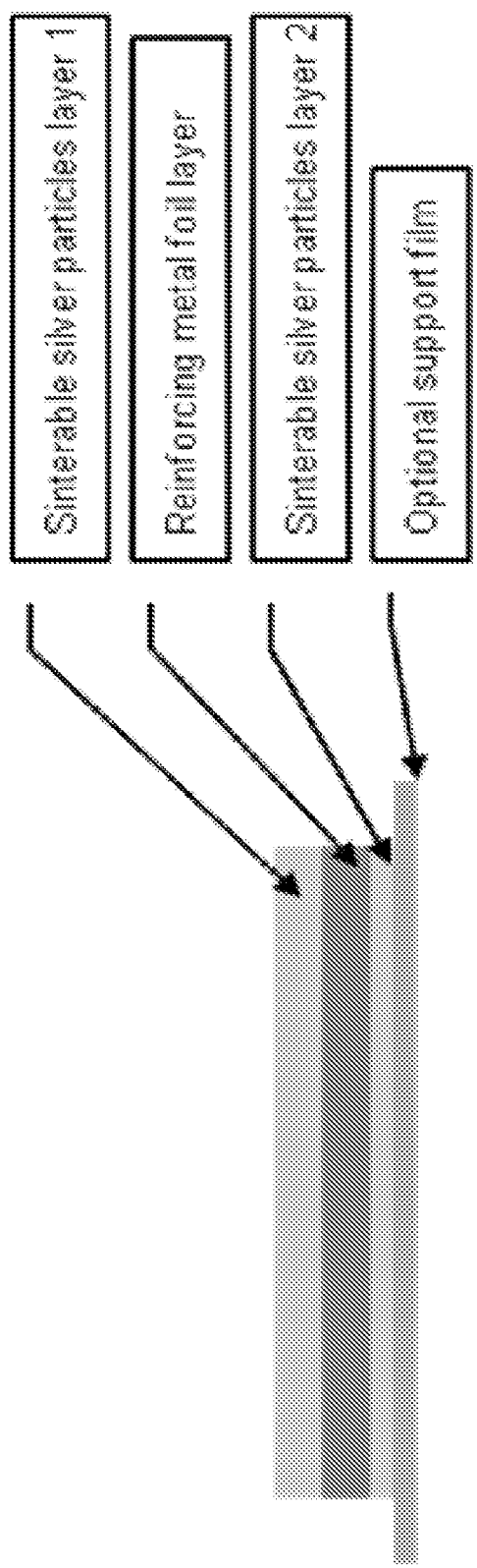
Figure 5C:
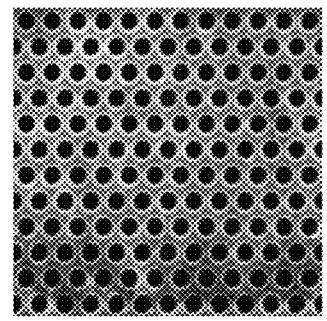
FIGS. 5A-5E present examples of metal foils in accordance with one or more embodiments.
Figure 5B:
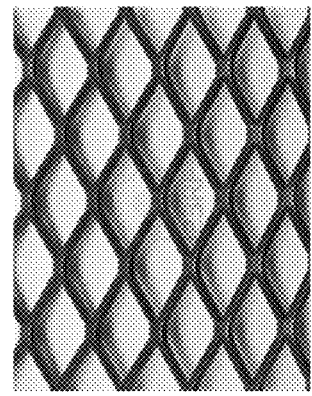
Figure 5A:
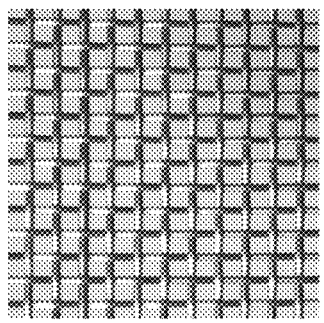
Figure 5E:
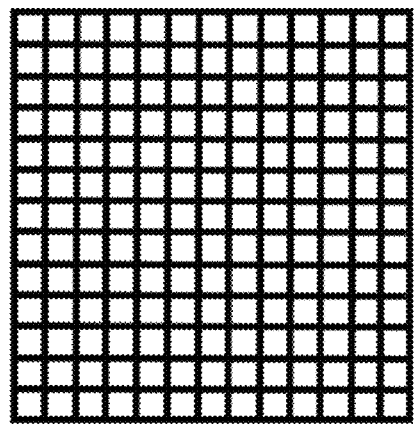
Figure 5D:
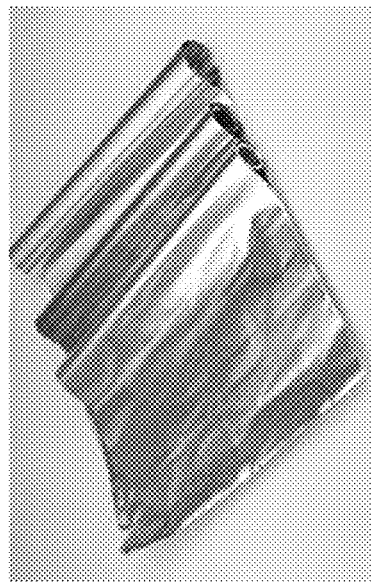

In accordance with one or more other embodiments, the silver film is a multilayer structure composed of at least two layers, but can be three or more layers: sinterable silver particles layer/metal foil layer or sinterable silver particles/metal foil/sinterable silver particles layer as schematically shown in FIGS. 3 and 4, respectively. Silver sinterable layers 1 and 2 can have the same composition and structure or can be different.

The reinforcing metal foil layer can be silver, copper, gold or any other metal or any alloy, such as metalized polymer and/or ceramic foil. The foils can be composite or clad structures with different layers of different metals and alloys mentioned previously. The metal foils can be solid, perforated or in the form of mesh. Examples are shown in FIGS. 5A-5E. The metal foils can be plated such as with Ag or Au for better sintering. The foil thickness can range from less than about 1 µm to about 300 µm and more. There is no real practical limit to the thickness. Any thickness that is considered a foil is suitable. The films can be supported by a thin plastic layer or stand alone.

Figure 6:
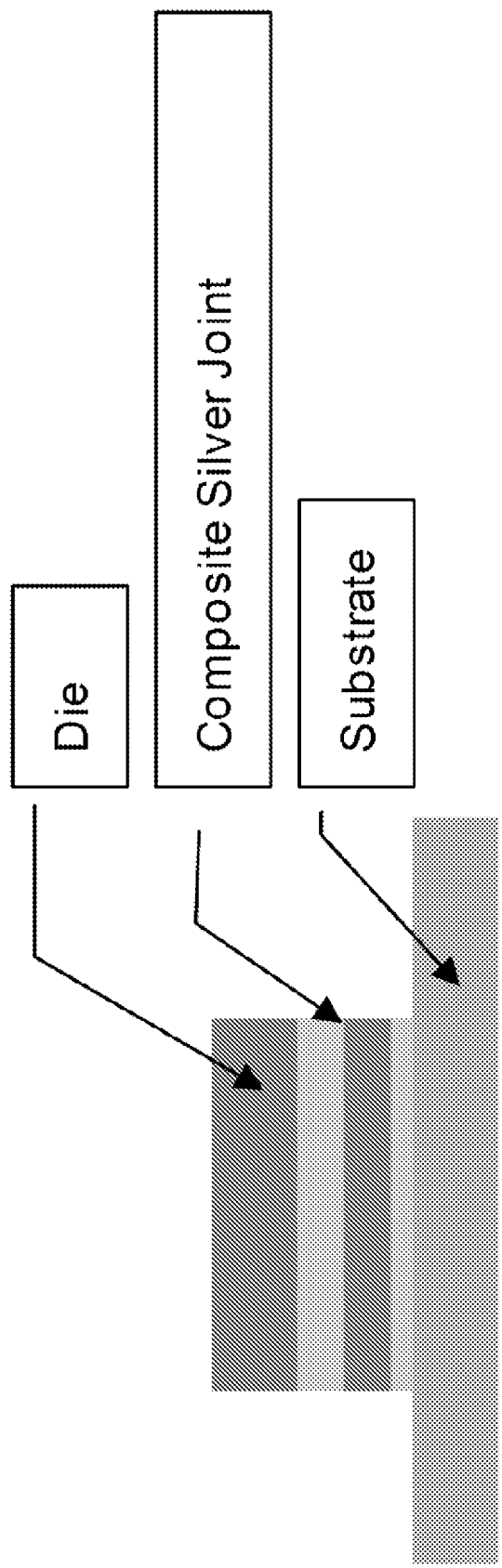
FIG. 6 presents a schematic of a die attach structure in accordance with or more embodiments.

The composite sinter silver films may be used in manufacturing of electronic and other devices in the same manner as non composite sinter silver films. The methods of using such films are described in detail in U.S. Patent Application Publication No. 2012/0114927 A1, which is hereby incorporated herein by reference in its entirety for all purposes. Such methods are applicable to the modified composite films discussed herein and may include lamination and die attach processes. A resulting structure is schematically shown in FIG. 6.

The silver sinterable films are composed of a matrix of silver nanoparticles and modifying material in the form of particles or films. The modifying material can be metallic and/or non-metallic powder of various shapes and/or solid metal layer. The composite silver films are designed to improve strength and elasticity of sintered silver joints. The composite films can be used for the joining of various parts for electronics manufacturing and other applications. The methods to use the silver sintered films are described in U.S. Patent Application Publication No. 2012/0114927 A1 incorporated by reference above.

As used herein, reflow soldering refers to a process in which solder paste is printed or dispensed, or a solder preform is placed, or both, on a surface of a circuit board, components are placed in or near the deposited solder, and the assembly is heated to a temperature sufficient to reflow the solder.

The methods and compositions described herein may be used in applications including, but not limited to, fabrication of power modules, power discrete devices, bipolar, power devices, thermoelectric coolers, energy harvesting devices, LED and MEMS assembly, stacked microprocessor and memory devices.

The function and advantages of these and other embodiments will be more fully understood from the following examples. The examples are intended to be illustrative in nature and are not to be considered as limiting the scope of the embodiments discussed herein.

EXAMPLES

Example 1

The silver films are made according to the procedure and formulation described in U.S. Patent Application Publication No. 2012/0114927 A1 incorporated herein by reference. The silver film composition is 98% by weight of silver nanoparticles and 2% by weight of organic binder (Film A). The performance of this film is compared to the one containing graphite particles. The composition of composite film is 97% by weight of silver nanoparticles, 1% by weight of graphite spherical particles of ~2-3 µm diameters, and 2% by weight of organic binder. Silicon dies 5×5 mm were attached to 3 mm thick copper substrates. The attachment was done at 10 MPa pressure, 250C for 90 s.

Figure 7:
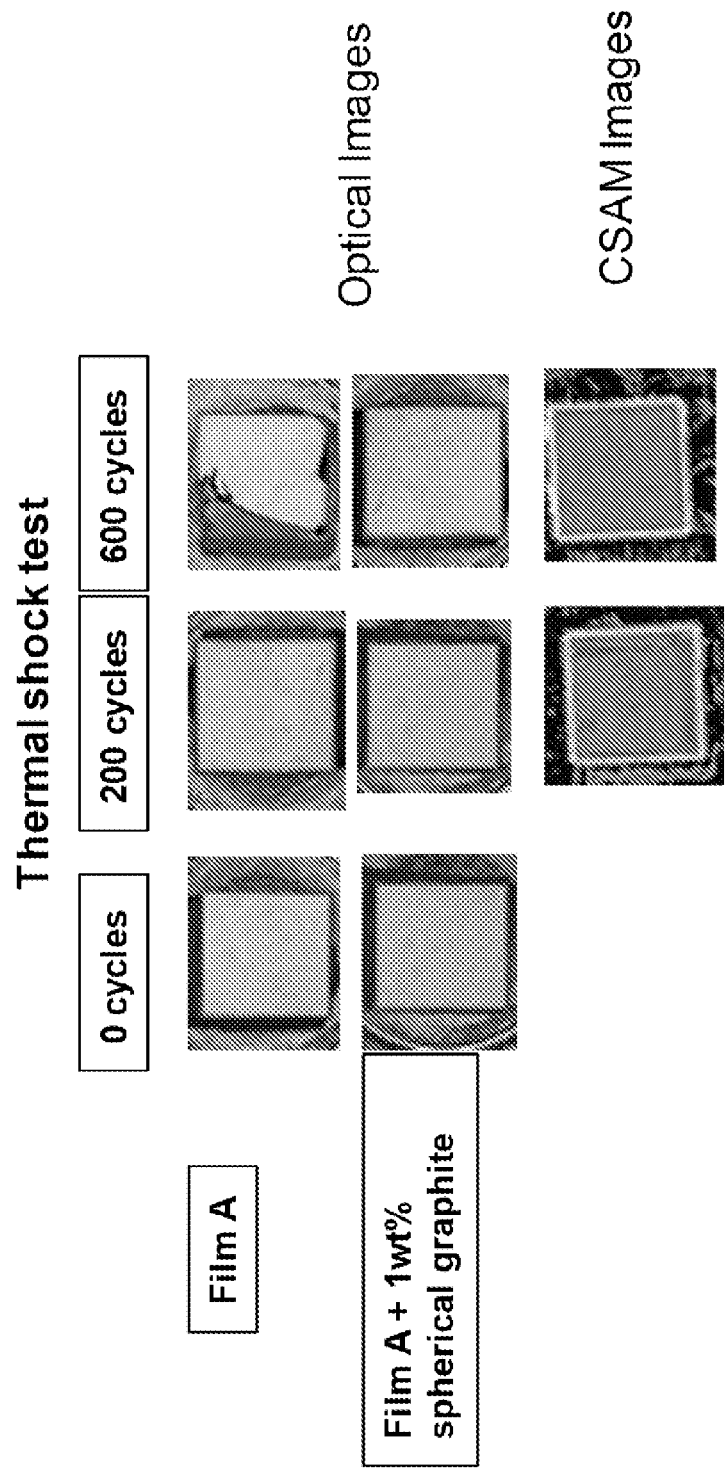
FIGS. 7-11B present data discussed in the accompanying Examples.

The die attach samples were subjected to liquid-to-liquid thermal shock test with temperature swing from −40° C. to 125° C. with 3 min hold at each temperature. Associated data is presented in FIG. 7. After 600 cycles the dies attached with silver film cracked and partially detached from the substrates as shown in the optical images. The parts attached with the composite film did not crack and appeared strongly attached to the substrates. Additional examination of these samples with scanning acoustic microscope showed no degradation of the composite silver joint due to thermal shock.

Example 2

The multilayer composite film is made by placing solid silver foil between two layers of sinterable nanosilver particles. The structure is pressed together and heated to 130° C. for 1-2 minutes. Due to an application of pressure and heat, the silver particles layers adhere to silver foil. The resulting composite multilayer film can be easily handled manually or with pick-and-place equipment. The multilayer film can be cut to a required die size to form free standing foils the same size as the dies to be attached. The multilayer film can also be laminated to the back side of the wafer which can be further diced to the individual dies as described in U.S. Patent Application Publication No. 2012/0114927 A1 hereby incorporated by reference.

Figure 8:
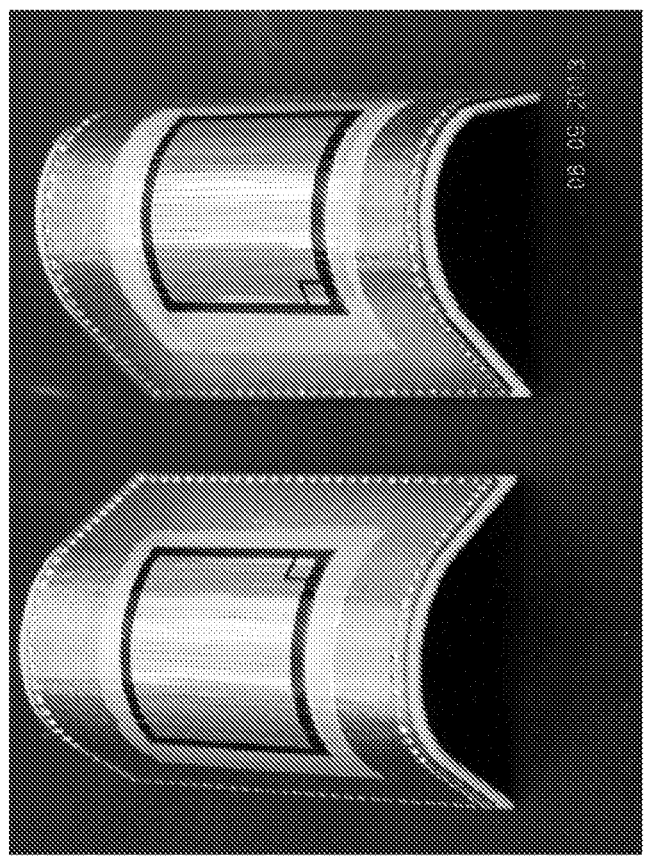

The multilayer composite silver film is used to attach Si dies 11×11 mm to copper finished DBC substrates. The attachment was done at 10 MPa, 250° C. for 90 seconds. The strength of the die attachment was tested by bending the samples across 10 mm mandrel. As shown in FIG. 8, the dies uniformly cracked without any de-lamination from the substrate indicating strong attachment.

Figure 9:
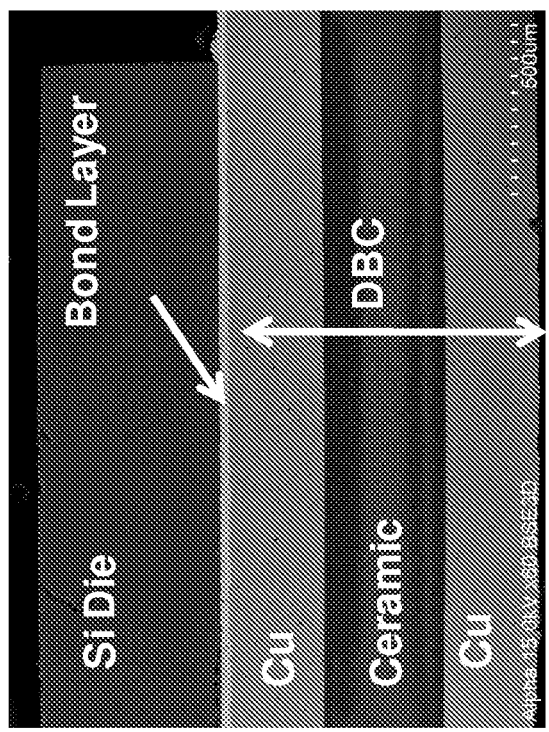

The samples are cross sectioned and examined with a scanning electron microscope (SEM). Low magnification images, as shown in FIG. 9, demonstrated uniform attachment and bond line thickness across the entire die.

Figure 10:
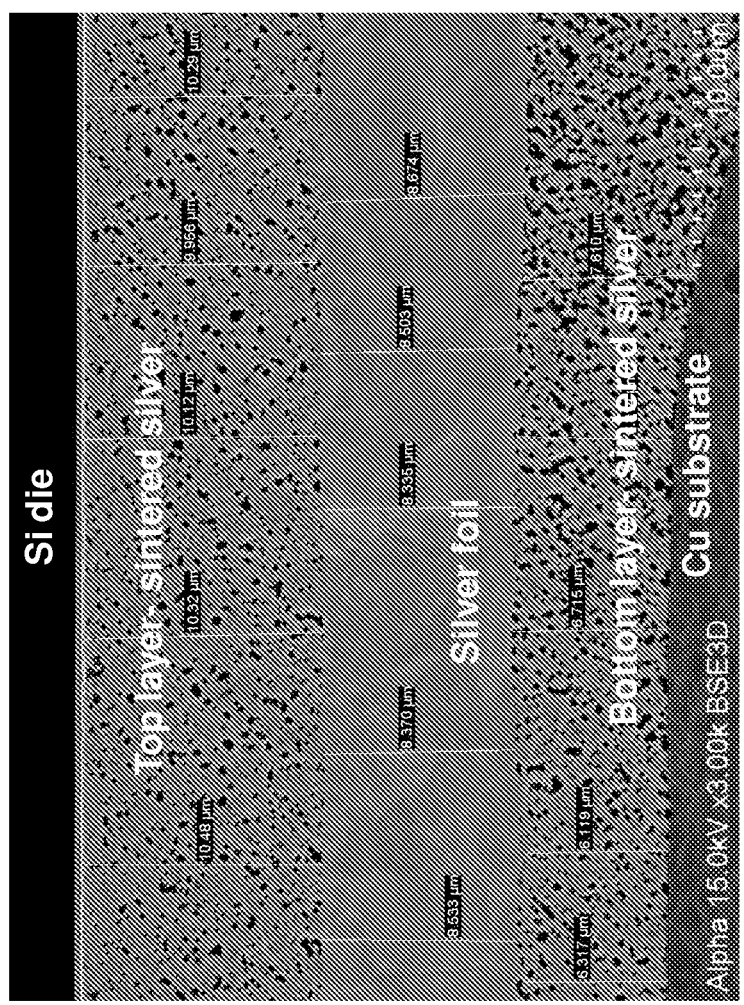

The high magnification SEM images as shown in FIG. 10 revealed details of the sintered joint. The top and the bottom sintered silver layers showed dense structure with good connection to the die, substrate and intermediate layer of silver foil. The thickness of the top sintered layer was ~10 µm and the bottom one ~6 µm. The silver foil thickness was 9 µm.

Figure 11B:
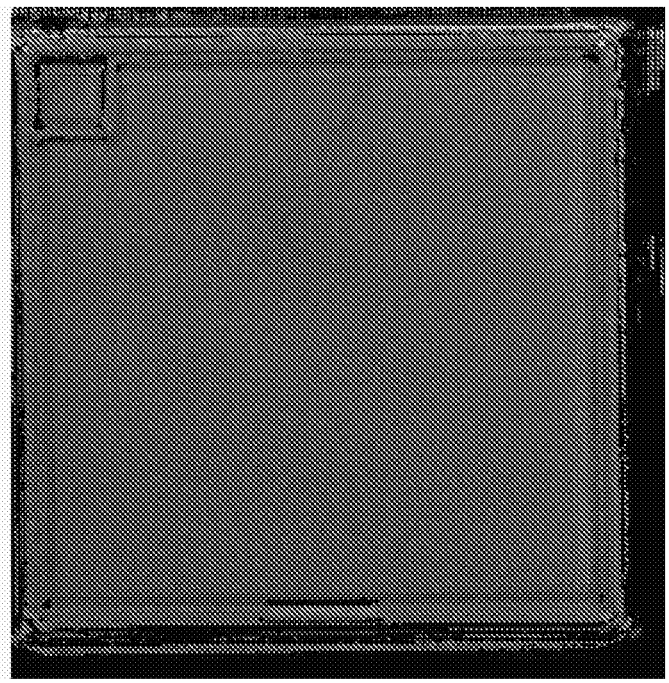
Figure 11A:
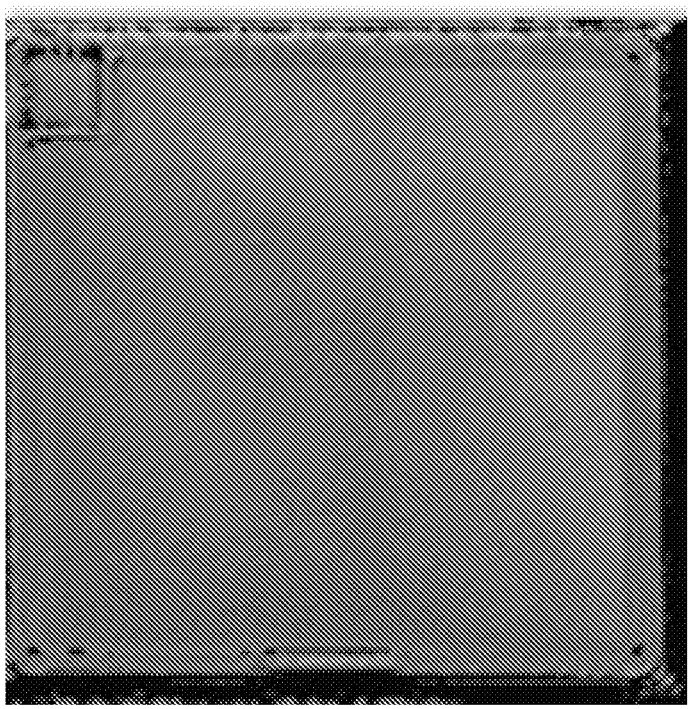

The die attach samples are subjected to liquid-to-liquid thermal shock with a temperature swing from −55° C. to 175° C. with 3 minutes hold at the temperature. The CSAM images shown in FIGS. 11A-11B reveal no joint degradation indication strong bonding after 500 thermal shock cycles.

It is to be appreciated that embodiments of the materials and methods discussed herein are not limited in application to the details of construction and the arrangement set forth herein. The materials and methods are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiment.

Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A silver film, wherein the silver film is a multilayer structure comprising a reinforcing silver foil layer between two layers of sinterable particles wherein each layer of sinterable particles comprises a mixture of sinterable silver particles and graphite particles, wherein the multilayer structure does not exhibit degradation after 500 thermal shock cycles between −40° C. and 125° C., wherein the silver film is configured for die attachment by application of heat and pressure to sinter the silver film.

2. The silver film of claim 1, wherein the reinforcing silver foil layer is configured to support the sinterable silver particles layer and the graphite particles.

3. The silver film of claim 1, wherein the graphite particles comprise spheres, flakes, fibers, flowers, nanowire, and combinations thereof.

4. The silver film of claim 3, wherein the size of the graphite particles is between 2 nm and 10 µm.

5. The silver film of claim 3, wherein at least one layer of sinterable particles further comprises at least one of copper, aluminum, glass, and carbon.

6. The silver film of claim 3, wherein a concentration of the graphite particles is between 0.1 wt % by weight to 50 wt % by weight.

7. The silver film of claim 1, wherein the reinforcing silver foil layer is a metalized polymer or a ceramic foil comprising silver cladding.

8. The silver film of claim 1, wherein the reinforcing silver foil layer is composite or a clad structure with different layers of different metals and alloys.

9. The silver film of claim 8, wherein the reinforcing metal foil layer is solid, perforated or in the form of mesh.

10. A method of laminating a die for attachment using the silver film of claim 1, the method comprising applying the silver film to a back of a die.

11. A method of attaching a die to a substrate comprising:
applying the silver film of claim 1 to a die; and
placing the die on a substrate with applied heat and pressure to sinter the film and connect the die to the substrate.

12. The silver film of claim 1 wherein the two layers of sinterable particles are in direct contact with the reinforcing silver foil layer.

13. The silver film of claim 1 wherein the silver film consists of the reinforcing silver foil layer and the two layers of sinterable particles.

14. The silver film of claim 13 wherein the reinforcing silver foil layer is sandwiched between and in direct contact with the two layers of sinterable particles.

15. The silver film of claim 1 wherein the silver film consists of the reinforcing silver foil layer, the two layers of sinterable particles, and a support layer.

16. The silver film of claim 15 wherein the reinforcing silver layer is sandwiched between and in direct contact with the two layers of sinterable particles and the support layer is attached to one of the layers of sinterable particles.

* * * * *